United States Patent [19]
Hess et al.

[11] Patent Number: 6,163,480
[45] Date of Patent: *Dec. 19, 2000

[54] MEMORY WITH HIGH INTEGRITY MEMORY CELLS

[75] Inventors: Richard F. Hess; Clarence Scott Smith, both of Glendale, Ariz.

[73] Assignee: Honeywell International Inc., Morristown, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/998,797

[22] Filed: Dec. 29, 1997

[51] Int. Cl.[7] ................................................. G11C 11/34
[52] U.S. Cl. ........................................ 365/185.08; 365/228
[58] Field of Search ................................ 365/185.08, 228

[56] References Cited

U.S. PATENT DOCUMENTS

| | | | |
|---|---|---|---|
| 3,739,355 | 6/1973 | Radcliffe, Jr. | 340/174 |
| 4,703,456 | 10/1987 | Arakawa | 365/185.08 |
| 4,706,220 | 11/1987 | Spence | 365/185.08 |
| 4,751,670 | 6/1988 | Hess | 364/424 |
| 4,980,859 | 12/1990 | Guterman et al. | 365/228 |
| 4,996,687 | 2/1991 | Hess et al. | 371/10.1 |
| 5,204,990 | 4/1993 | Blake et al. | 257/904 |
| 5,313,625 | 5/1994 | Hess et al. | 257/904 |
| 5,412,612 | 5/1995 | Oyama | 365/228 |
| 5,519,831 | 5/1996 | Holzhammer | 365/228 |
| 5,525,923 | 6/1996 | Bialas, Jr. et al. | 327/154 |
| 5,572,460 | 11/1996 | Lien | 365/154 |
| 5,631,863 | 5/1997 | Fechner et al. | 365/156 |
| 5,838,614 | 11/1998 | Estakhri et al. | 365/230.03 |

*Primary Examiner*—David Nelms
*Assistant Examiner*—M. Tran

[57] ABSTRACT

A memory system for a digital computer includes a nonvolatile random access memory for storing past and present values of state variables is immune from electromagnetic transients and other disturbances which can affect the integrity of the memory. Each memory cell is designed with an energy storage device and logic devices which control the logic sequence for charging of the energy storing devices. These memory cells are aligned in an array and specially designed system is included with this that takes into account the length of time required in order to charge each cell in the array.

10 Claims, 3 Drawing Sheets

| TIME INTERVAL | INPUT | A | B | C | D | E | F | G | OUTPUT |
|---|---|---|---|---|---|---|---|---|---|
| 1 | 0 | 0 | 0 | 0 | 0 | 0 | 0 | 0 | 0 |
| 2 | 1 | 1 | 0 | 0 | 1 | 0 | 0 | 0 | 0 |
| 3 | 1 | 1 | 0 | 0 | 1 | 0 | 1 | 0 | 1 |
| 4 | 1 | 1 | 0 | 0 | 1 | 0 | 1 | 0 | 1 |
| 5 | 0 | 0 | 1 | 0 | 1 | 1 | 1 | 0 | 1 |
| 6 | 0 | 0 | 1 | 0 | 1 | 1 | 1 | 1 | 1 |
|  |  |  |  |  |  |  |  |  |  |
| 1 | 0 | 0 | 1 | 0 | 1 | 1 | 1 | 1 | 1 |
| 2 | 1 | 0 | 0 | 1 | 0 | 1 | 1 | 1 | 1 |
| 3 | 1 | 0 | 0 | 1 | 0 | 1 | 0 | 1 | 0 |
| 4 | 1 | 0 | 0 | 1 | 0 | 1 | 0 | 1 | 0 |
| 5 | 0 | 0 | 0 | 0 | 0 | 0 | 0 | 1 | 0 |
| 6 | 0 | 0 | 0 | 0 | 0 | 0 | 0 | 0 | 0 |

MEMORY WITH HIGH INTEGRITY MEMORY CELLS

FIELD OF THE INVENTION

The present invention is related to memory systems and in particular a memory system hardened for electromagnetic and radiation events.

BACKGROUND OF THE INVENTION

Digital computers are utilized to implement complex banking and business systems as well as in the control of industrial processes. The digital computer is also finding wide spread usage in the control of vehicles such as aircraft, spacecraft, marine and land vehicles. For example, in present day automatic flight control systems for commercial and military transports, the digital computer is supplanting the analog computer of prior art technology.

Present day digital computers are comprised of hundreds of thousand of discrete semi-conductor or integrated circuit bi-stable elements generically denoted as latches. A latch is a high speed electronic device that can rapidly switch between two stable states in response to relatively low amplitude, high speed signals. Latch circuits are utilized to construct most of the internal hardware of a digital computer such as the logic arrays, the memories, the registers, the control circuits, the counters, the arithmetic and logic unit and the like.

As a consequence, digital computers are subject to disturbances which may upset the digital circuitry but not cause permanent physical damage. For instance, since present day digital computers operate at nanosecond and subnanosecond speeds, rapidly changing electronic signals normally flow through the computer circuits. Such signals radiate electromagnetic fields that couple to circuits in the vicinity thereof These signals can not only set desired latches into desired states, but can also set other latches into undesired states. An erroneously set latch can unacceptably compromise the data processed by the computer or can completely disrupt the data processing flow thereof. Functional error modes without component damage in digital computer based systems is denoted as digital system upset of soft fault.

Digital system upset can also result from spurious electromagnetic signals, such as those caused by lighting, that can be induced on the internal electrical cables throughout the aircraft. Such transient spurious signals can propagate to internal digital circuitry setting latches into erroneous states. Additionally, power surges, radar pulses, static discharges, cosmic radiation, atmospheric neutrons, radiation from nuclear weapon detonation, etc. may also result in digital system upset. When subject to such conditions, electrical transients are induced on system lines and data buses or energy is deposited within sensitive regions of a semiconductor device resulting in logic state changes that prevent the system from performing as intended after the transient. Additionally, transient energy can penetrate into the random access memory (RAM) area of the computer and scramble the data stored therein. Since electromagnetic transients can be induced on wiring throughout an aerospace vehicle, reliability functions based on the use of redundant electronic equipment can also be compromised.

A digital computer is susceptible to complete disruption if an incorrect result is stored in any of the memory elements associated with this complex "sequential machine". These upsets could be a contributor to the number of unconfirmed removals and adversely affect the MTBF/MTBRU ratio of the computer. Safety-critical digital avionics computer applications such as fly-by-wire or autoland cannot tolerate system upset due to transient conditions such as electromagnetic interference (EMI), inherent noise, lightning, electromagnetic pulses (EMP), high intensity radiated fields (HIRF), transient radiation effects on electronics (TREE), cosmic radiation or atmospheric neutrons. Safety-critical digital computers must be able to tolerate such transient upsets without affecting the performance of the critical application.

As newer digital technologies are introduced, the amount of energy necessary to change the state of a latch/memory element is rapidly dropping, thereby making these elements more susceptible to upset due to EMI, lightning, EMP, HIRF, TREE, cosmic radiation or atmospheric neutrons.

Prior safety critical digital computers use high speed latch circuits to provide the volatile random access memory (RAM) areas needed for dynamic data and read only memory (ROM) areas in which the application program resides. The hardened memory described in this document provides an area where dynamic data can be stored with an arbitrarily high degree of non-volatility. The degree of non-volatility could be set as a result of various constraints (e.g. type of system dynamics, cost, weight and volume). The data targeted for the hardened memory would be that which is critical for the dynamic restoration, of a digital computer, to the operational state/status prior to the occurrence of a soft fault such that there are no adverse effects on safety critical functions it may provide.

SUMMARY OF THE INVENTION

A digital memory system is described herein which includes a portion which is hardened to withstand a high energy event. The system includes a volatile RAM, a nonvolatile RAM, and an interface means between the two memories. The nonvolatile RAM includes a data latch which receives information transmitted over a data line. Data from the latch is transmitted into an array of hardened memory cells. An output buffer is in electrical connection with the array of memory cells which, in response from a signal from a controller, outputs the data stored in the array. The controller also controls the operation of the data latch.

Each hardened memory cell includes a combination of logic and energy storage devices. The energy storage means must be either fully charged or fully discharged in order to change the state of the memory cell. The logic devices control the charging and discharging of the energy storage devices based on the incoming data signal. If a transient signal is received over the data line, a logic device may instantaneously change state, but the overall state of the memory cell will remain unchanged.

DESCRIPTION OF THE PREFERRED EMBODIMENT

Figure 1:
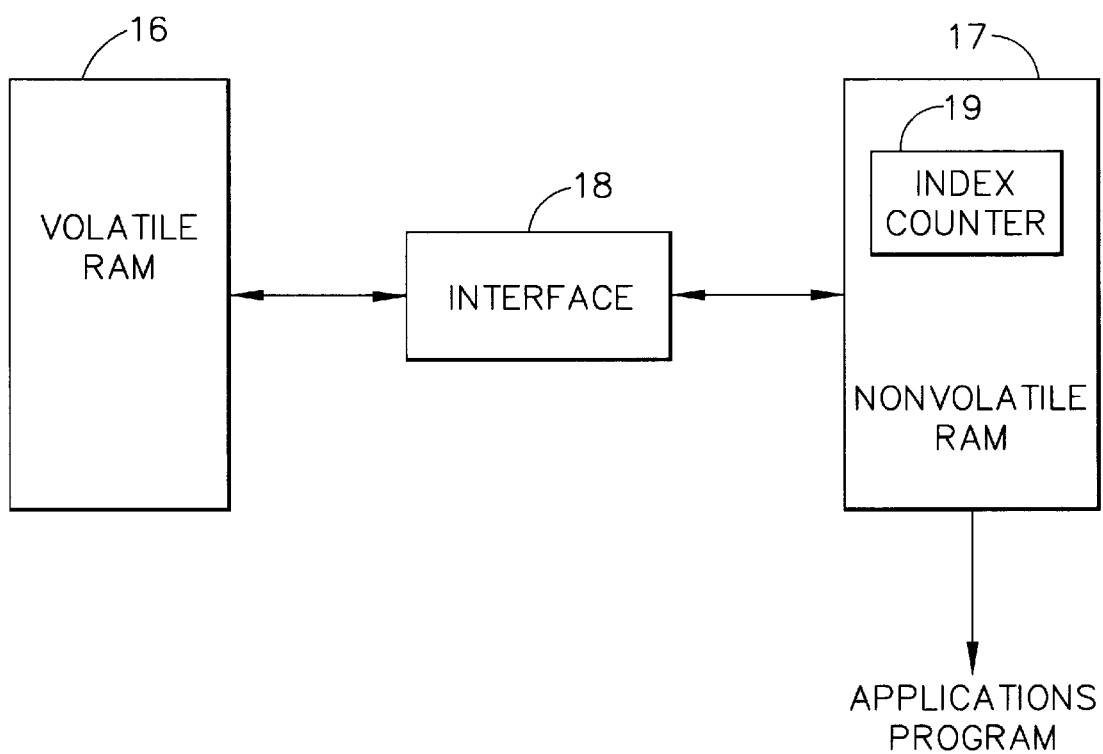
FIG. 1 shows a schematic block diagram of a computer RAM architecture which incorporates the hardened memory system.

Disclosed in FIG. 1 is a random access memory (RAM) structure for a digital computer. The digital computer also includes an application program read only memory (ROM) (not pictured) for storing the operative program for performing all the functions required by the computer in the application in which it is utilized. If the computer is utilized in an automatic flight control system, the operative program will include all the functions required thereby.

The memory for the digital computer is described as volatile RAM 16 which stores the variables utilized by the application program. The RAM 16 contains predetermined locations for the storage of various types of data provided to the computer from the external environment, with which it interfaces, as well as processed data from a central processing unit (CPU). The variables processed by the CPU include control and logic state variables as well as standard data. In accordance with the invention, the volatile RAM 16 is connected to a non-volatile RAM 17. RAM 17 is a memory for storing the control and logic state variables. The connection between the two memories is made by interface 18.

As an example, in an automatic flight control system application, the non-volatile RAM 17 would probably include a location dedicated to the storage of the present (and probably past) values of an integrator for glide slope beam error. The control and logic state variables are utilized in an application program which provides the desired function for the overall system. In FIG. 1, RAM 16 and RAM 17 are shown as separate elements, however one skilled in the art would realize that RAM 17 could be incorporated into RAM 16.

The volatile RAM 16 is a conventional read/write random access memory, a variety of which are commercially procurable for utilization in implementing the present invention. The non-volatile RAM 17 is of the type that damage to the logic components of the read/write cell would occur before data stored in the device would be compromised by an external event such as a transient from a harsh electromagnetic environment that penetrated the memory device. Data preservation in the non-volatile RAM 17 is predicated upon the ability of the memory cell to store large levels of energy such as electric, magnetic, FM photon relative to that contained in the interfering agent. One criteria for the amount of energy needed to be stored would be that amount in a momentary event that could damage the logic (semiconductor, etc . . . ) components in the memory cell (thus design criteria would be reduced to a consideration of component damage). Thus it is appreciated that the non-volatile RAM 17 provides high integrity non-volatile storage for the control and logic state variables in the presence of harsh environments that may cause digital computer upset.

In accordance with the invention, the present and past values of control variables and the past values of logic variables are stored and retrieved from the non-volatile RAM 17. For the purposes of this invention, the control state variables are outputs from integrators and relatively long time constant filters, and as such change slowly over time. Logic state variables (mode state changes) only change occasionally. An index counter 19 is utilized to index the reading and writing accesses to the non-volatile RAM 17 by providing the offset that is added to the base address of the location in RAM 17 of a state variable to provide for the multiple storage thereof.

When a state variable is processed, the retrieve and store instructions associated therewith provide the base address therefore. The index value provided by the counter, which value is incremented during each program iteration, steps the storage and retrieval of the state variable through multiple locations in the nonvolatile RAM 17. When an upset is detected and the application program is vectored to a restart location, the value in the index counter is decremented so that the most current valid values (present or past) of the control and logic state variables are retrieved and utilized in the reinitialization and restart procedure. The most current values are employed because the upset may have occurred during a writing procedure to the non-volatile RAM 17 resulting in an uncertainty in the integrity of the present values. The operation of the index counter and the entire memory system, in connection with the realization of a high integrity digital processor architecture, is described in detail in U.S. Pat. No. 4,751,670 which is hereby incorporated by reference.

Figure 2:
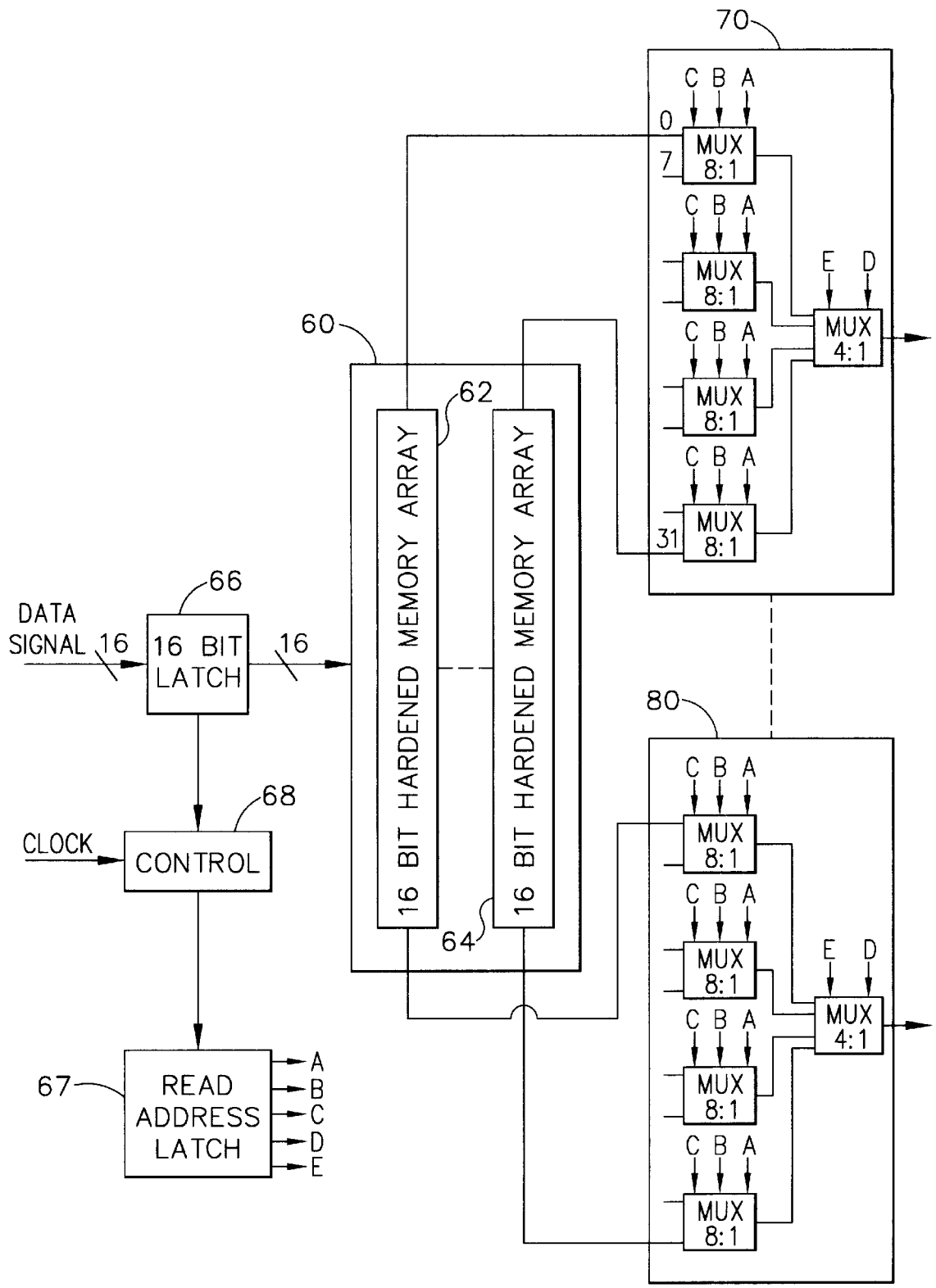
FIG. 2 shows a block diagram of the hardened memory portion of the RAM architecture.

Disclosed in FIG. 2 is a system diagram for the non-volatile RAM 17. Information to be stored in the memory arrays is first received at latch 66. This latch can receive 16 bits in parallel. This information is then fed in parallel to memory array 60. In the preferred embodiment of the invention, memory 60 is made up of 32 separate 16 bit arrays. In FIG. 2, they are represented by the first array 62 and the final array 64. After the incoming data is received in latch 66, it is then stored in memory array 60 in response to signals from controller 68. The controller also controls the output of the stored data through 32 separate output buffers. They are represented by the first output buffer 70 and the $32^{nd}$ output buffer 80. In each output buffer there are four 8×1 multiplexers. As a representation for all the output buffers, multiplexers 72, 74, 76, 78 are shown in output buffer 70, and multiplexers 82, 84, 86 and 88 are shown in output buffer 80. The operation of the multiplexers is controlled through the read address latch 67 which in turn is controlled by controller 68. In each buffer, the 8×1 linked multiplexers feed into a single 4×1 multiplexer. The 4×1 multiplexers are shown as element 75 in output buffer 70 and element 85 in output buffer 80. These 4×1 multiplexers are also controlled by read address latch 67.

Each 16 bit hardened memory array is made up of individual memory cells. In order to be part of a hardened memory, each of these cells must be able to withstand energy (electromagnetic, cosmic, etc . . . ) pulse disturbances which can disrupt a normal memory array. A configuration of these memory cells which implements a "robust trigger flip-flop" is described in greater detail below.

Figures 3, 4:
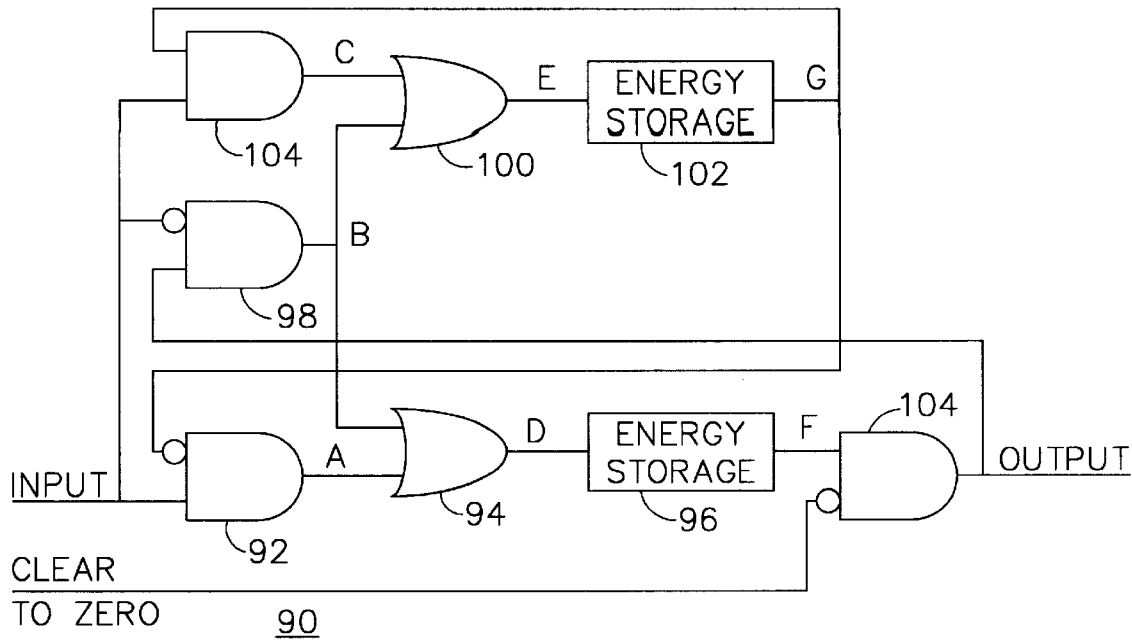
FIG. 3 is a diagram of a individual hardened memory cell.
FIG. 4 is a transition sequence table which displays the status of different parts of each hardened memory cell.

Shown in FIG. 3 is a detailed diagram of an individual hardened memory cell. The memory cell is constructed so that any information stored in this cell is protected from the effects of energetic transients. The data signal which changes the state of the cell is received at the first input of AND gate 92. The output of AND gate 92 is received at an input to OR gate 94. The output of OR gate 94 provides the charging to first energy storage device 96. In the preferred embodiment of the invention, energy storage device 96 is a capacitor, however those skilled in the art would realize that any device which takes predetermined amount of time to charge and hold this energy (magnetic, optic, etc . . . ) charge over time could be used in the memory cell. The output of the energy storage device runs to a first input of AND gate 104. At the second input of AND gate 104 a 0 signal can be received (through a logic inversion) to set the memory cell to zero. The output of AND gate 104 is the output of the memory cell, however this output also feeds back (through a logic inversion) to an input of AND gate 98. The output AND gate 98 runs to inputs of both OR gates 94 and 100. The output of OR gate 100 serves to charge the second energy storage device 102.

The output energy storage device 102 runs to the input of AND gate 104 and (through a logic inversion) AND gate 92.

The output of AND gate 104 runs to the second input of OR gate 100. The input signal which runs to AND gate 92 also acts as an input signal (through a logic inversion) for AND gate 98 and AND gate 104.

The purpose of the logic and energy storage devices in the above described memory cell is to provide the sequence of logic states which result in the "robust trigger flip-flop" resulting in immunity to the effects from transients which may be transmitted over the input line or energy which may be deposited within a logic device. In the case where the electromagnetic surge is large enough, these logic devices would burn out before the charge on either energy storage device 96 or 102 is affected.

The operation of memory cell 90 can be better understood through study of the transition sequence table disclosed in FIG. 4. The time intervals in the left hand column represent time it takes for one of the components in the cell to change states. The second column is the state of the data signal transmitted over the input line to change the state of the memory cell. Columns A–G represent the state at the output of one of the logic elements in the memory cell. A is located at the output of AND gate 92, B is at the output of AND gate 98, C is at the output AND gate 104, D is at the output of OR gate 94, E is at the output of OR gate 100, F is at the output of the first energy storage device 96, and G is at the output of the second energy storage device 102. Although it is not explicit in the table, the high or low state of the memory cell is a function of an energy storage element that can be configured to store an arbitrarily large amount of energy and requires the low to high and high to low transition of the input to last sufficiently long for the energy required to be deposited in the energy storage element.

It is the amount of energy stored that determines the degree of non-volatility of the memory cell and it is the degree of non-volatility of the memory cell that provides the foundation of the hardness of the memory because the non-volatility exists at the memory cell or "BIT" level. The amount of energy storage required is a function of the application and the energy expected to be contained in the various intense threats, that are transient in nature, to which a digital computer can be exposed by the environment in which it operates. Ideally, the amount of energy needed to change the memory cell state would be many orders of magnitude greater than the energy content of any transient threats which might reach the memory cell. It is conceivable that the components around the memory storage element would reach the point of being damaged before the energy in the memory storage element would be changed to the point that an unwanted state change of the memory cell could occur.

As can be seen in FIG. 3 and understood in the table in FIG. 4, anytime a electromagnetic surge is received over the input line it first must change the appropriate states of AND gate 104, AND gate 98 and AND gate 92 as well as OR gates 94 and 100, as well as the energy in either energy storage device 96 or energy storage device 102 before the state of the energy state could be changed. The required logic sequence change provides sufficient protection so that the state of either of the energy storage devices is not changed and thus the state of the memory cell is not changed.

Described above is the preferred embodiment of the invention. One skilled in the art would realize that many different modification to the above embodiment could be made without departing from the spirit, scope, and teaching of the invention.

I claim:

1. A high integrity random access memory (RAM) architecture resistant to a transient signal comprising:
   a volatile RAM;
   a non-volatile RAM, which comprises:
      a first data latch which receives data over a data line;
      a controller which controls latching of the data;
      an array of memory cells for storing data received over the data line wherein each of the memory cells comprises:
         an energy storage component which requires a predetermined amount of time to charge, wherein said predetermined time is longer than a duration of the transient signal; and
         a logic system configured to receive an input line signal and connected to the memory cell to charge the energy storage component; and
      an output system in electrical connection with the array of memory cells and the controller, which in response to control signals from the controller identifies and outputs data stored in the array of memory cells; and
   an associated interface connected to the volatile RAM and the nonvolatile RAM.

2. The high integrity RAM architecture of claim 1 wherein the logic system is a series of ANI) and OR gates.

3. The high integrity RAM architecture of claim 2 wherein said energy storage component is made up of first and second storage cells.

4. The high integrity RAM architecture of claim 3 wherein the logic system further comprises:
   a first AND gate with first and second inputs and an output, where said first input receives the data signal and the second input receives an output from the second storage cell;
   a first OR gate with first and second inputs and an output, where the first input of the first OR gate receives the output of the first AND gate and the output of the first OR gate is in electrical contact with the input of the first storage cell;
   a second AND gate with first and second inputs and an output, where the first input is connected to a clear to zero signal, the second input is connected to the output of the first storage cell, and the output is indicative of the state of the memory cell;
   a third AND gate with first and second inputs and an output; where the first input is connected to the output of the second AND gate and the second input is connected to the data signal;
   a second OR gate with first and second inputs and an output, the first input is electrically connected to the output of the third AND gate and the second input of the first OR gate and the output is connected to the input of the second storage cell; and
   an AND gate with first and second inputs and an output, where the first input is connected to the data signal, the second input is connected to the output of the second storage cell, and the output is connected to the second input of the OR gate.

5. The high integrity RAM architecture of claim 4 wherein the first and second storage cells are capacitors.

6. A high integrity memory cell resistant to a transient signal comprising:
   an energy storage system which requires a predetermined amount of time to charge, wherein said predetermined time is longer than a duration of the transient signal;

a logic system configured to receive an input line signal and connected to the memory cell to charge the energy storage system, and wherein the logic system is a series of AND and OR gates.

7. The high integrity memory cell of claim 6 wherein said energy storage system is made up of first and second storage cells.

8. The high integrity memory cell of claim 7 wherein the logic system further comprises:

a first AND gate with first and second inputs and an output, where said first input receives the data signal and the second input receives an output from the second storage cell;

a first OR gate with first and second inputs and an output, where the first input of the first OR gate receives the output of the first AND gate and the output of the first OR gate is in electrical contact with the input of the first storage cell;

a second AND gate with first and second inputs and an output, where the first input is connected to a clear to zero signal, the second input is connected to the output of the first storage cell, and the output is indicative of the state of the memory cell;

a third AND gate with first and second inputs and an output where the first input is connected to the output of the second AND gate and the second input is connected to the data signal;

a second OR gate with first and second inputs and an output, the first input is electrically connected to the output of the third AND gate and the second input of the first OR gate and the output is connected to the input of the second storage cell; and an AND gate with first and second inputs and an output, where the first input is connected to the data signal, the second input is connected to the output of the second storage cell, and the output is connected to the second input of the OR gate.

9. The high integrity memory cell of claim 8 wherein the first and second storage cells are capacitors.

10. A non-volatile RAM resistant to a transient signal, which comprises:

a first data latch which receives data over a data line;

a controller which controls latching of the data;

an array of memory cells for storing data received over the data line wherein each of the memory cells comprises:

an energy storage component which requires a predetermined amount of time to charge, wherein said predetermined amount of time is longer than a duration of the transient signal; and a logic means configured to receive an input line signal and connected to the memory cell to charge the energy storage component; and an output system in electrical connection with the array of memory cells and the controller, which in response to control signals from the controller identifies and outputs data stored in the array of memory cells.

* * * * *